(12) United States Patent
Lee et al.

(10) Patent No.: US 12,292,348 B2
(45) Date of Patent: May 6, 2025

(54) ELECTRONIC DEVICE

(71) Applicant: Merry Electronics(Shenzhen) Co., Ltd., ShenZhen (CN)

(72) Inventors: Yueh-Kang Lee, Taichung (TW); Jia Yin Wu, Taichung (TW); Yung-Hsiang Chang, Taichung (TW)

(73) Assignee: Merry Electronics(Shezhen) Co., Ltd., ShenZhen (CN)

( * ) Notice: Subject to any disclaimer, the term of this patent is extended or adjusted under 35 U.S.C. 154(b) by 277 days.

(21) Appl. No.: 18/165,260

(22) Filed: Feb. 6, 2023

(65) Prior Publication Data
US 2023/0175910 A1 Jun. 8, 2023

Related U.S. Application Data

(63) Continuation-in-part of application No. 17/557,050, filed on Dec. 21, 2021, now Pat. No. 11,952,264.

(30) Foreign Application Priority Data

Oct. 20, 2021 (TW) ................... 110138951
Sep. 30, 2022 (TW) ................... 111137251

(51) Int. Cl.
*H04R 19/04* (2006.01)
*B81B 3/00* (2006.01)
*G01L 19/06* (2006.01)

(52) U.S. Cl.
CPC ........ *G01L 19/0609* (2013.01); *B81B 3/0051* (2013.01); *H04R 19/04* (2013.01); *B81B 2201/0257* (2013.01)

(58) Field of Classification Search
CPC ................. H04R 19/005; H04R 19/04; B81B 2201/0257; B81C 1/00158
See application file for complete search history.

(56) References Cited

U.S. PATENT DOCUMENTS

| | | | | |
|---|---|---|---|---|
| 2020/0213701 | A1* | 7/2020 | Cheng | H04R 1/08 |
| 2021/0409873 | A1* | 12/2021 | Jiang | H04R 19/04 |
| 2023/0269543 | A1* | 8/2023 | Nakamoto | H04R 19/04 |
| | | | | 381/91 |

FOREIGN PATENT DOCUMENTS

| | | |
|---|---|---|
| TW | I373974 B * | 10/2012 |
| WO | WO-2022000794 A1 * | 1/2022 |

\* cited by examiner

*Primary Examiner* — Herbert K Roberts
(74) *Attorney, Agent, or Firm* — JCIPRNET

(57) ABSTRACT

An electronic device includes a substrate, a sensor, a pressurizing component, and a stopping structure. The substrate has a bearing surface. The sensor is disposed on the bearing surface. The pressurizing component is disposed on the sensor. The stopping structure is disposed between the pressurizing component and the sensor. The stopping structure has opposite upper and lower surfaces and a plurality of openings, and each opening penetrates from the upper surface to the lower surface.

13 Claims, 5 Drawing Sheets

ELECTRONIC DEVICE

CROSS-REFERENCE TO RELATED APPLICATION

This application is a continuation-in-part application of and claims the priority benefit of U.S. application Ser. No. 17/557,050, filed on Dec. 21, 2021, which claims the priority benefit of Taiwan application Ser. No. 110138951, filed on Oct. 20, 2021. This application also claims the priority benefit of Taiwan application Ser. No. 111137251, filed on Sep. 30, 2022. The entirety of each of the above-mentioned patent applications is hereby incorporated by reference herein and made a part of this specification.

BACKGROUND

Technical Field

The disclosure relates to an electronic device.

Description of Related Art

In electronic devices, the performance of frequency response is extremely important, and the performance of frequency response is often affected by its air damping. Therefore, how to effectively adjust the air damping of electronic devices such that the frequency response flattens is a challenge.

SUMMARY

An electronic device is provided in this disclosure, which may effectively adjust its air damping such that the frequency response flattens.

An electronic device of the disclosure includes a substrate, a sensor, a pressurizing component, and a stopping structure. The substrate has a bearing surface. The sensor is disposed on the bearing surface. The pressurizing component is disposed on the sensor. The stopping structure is disposed between the pressurizing component and the sensor. The stopping structure has an upper surface and a lower surface that are opposite to each other, and multiple openings. Each of the openings penetrate from the upper surface to the lower surface.

In an embodiment of the disclosure, in a top view, a shape of each of the openings includes a circle, a rectangle, an arc-shape, an L-shape, or a combination thereof.

In an embodiment of the disclosure, the openings are multiple circular openings, and hole diameters of the circular openings are between 0.03 millimeters (mm) and 0.1 mm.

In an embodiment of the disclosure, the openings are multiple arc-shaped openings, and disposition positions of the arc-shaped openings form at least one circular outline.

In an embodiment of the disclosure, the openings are multiple L-shaped openings, and disposition positions of the L-shaped openings form at least one rectangular outline.

In an embodiment of the disclosure, the openings are disposed in an array and are symmetrically arranged.

In an embodiment of the disclosure, the openings have at least different sizes or different shapes.

In an embodiment of the disclosure, the electronic device further includes a first adhesive layer. The first adhesive layer is disposed on the upper surface of the stopping structure to cover a portion of the openings.

In an embodiment of the disclosure, a thickness of the first adhesive layer is between 10 micrometers ($\mu m$) and 50 $\mu m$.

In an embodiment of the disclosure, the pressurizing component includes a mass and a vibration membrane, in which a gap is formed between the mass and the stopping structure.

In an embodiment of the disclosure, the first adhesive layer and the mass are staggered in an orthographic projection direction.

In an embodiment of the disclosure, the first adhesive layer is located on both sides and/or below the mass, and a thickness of the first adhesive layer is smaller than the gap.

In an embodiment of the disclosure, the electronic device further includes a second adhesive layer. The second adhesive layer is disposed on the upper surface of the stopping structure and surrounds the first adhesive layer, in which a thickness of the second adhesive layer is equal to or greater than the thickness of the first adhesive layer.

In an embodiment of the disclosure, the electronic device further includes a partition wall structure. The partition wall structure is disposed on the bearing surface and surrounds the sensor, in which the pressurizing component, the partition wall structure, and the substrate together form a first chamber. The stopping structure separates the first chamber into at least two cavities, and air in the two cavities is connected through multiple openings.

Based on the above, the stopping structure of the electronic device of the disclosure has a design of multiple penetrating openings. In this way, the size of a single opening may be reduced, and the friction between the air and the opening boundary may be increased, so that the peak of the frequency response curve may be attenuated. Therefore, its air damping may be effectively adjusted to flatten the frequency response.

In order to make the above-mentioned features and advantages of the disclosure comprehensible, embodiments accompanied with drawings are described in detail below.

DETAILED DESCRIPTION OF DISCLOSED EMBODIMENTS

Figure 1A:
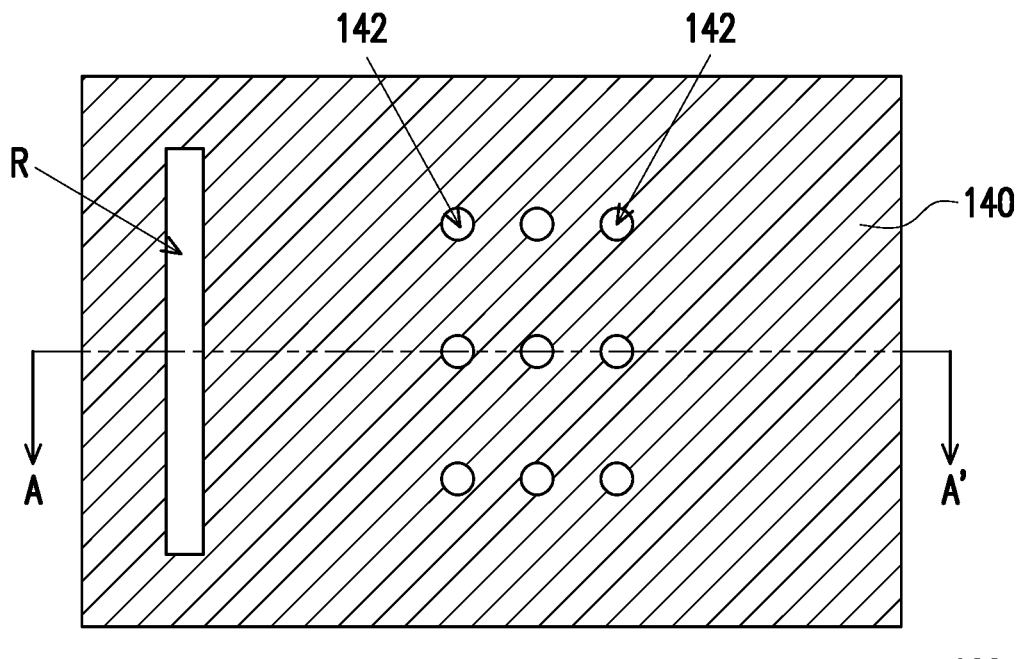
FIG. 1A is a top schematic view of an electronic device according to an embodiment of the disclosure.

Directional terms (e.g., up, down, right, left, front, back, top, bottom) as used herein are used for reference only to the drawings and are not intended to imply absolute orientation.

The disclosure is more fully described with reference to the drawings of this embodiment. However, the disclosure may be embodied in various different forms and should not be limited to the embodiments set forth herein only. The thickness, dimension, or size of layers or regions in the drawings may be exaggerated for clarity. The same or similar reference numerals denote the same or similar elements, and the descriptions are not repeated in the following paragraphs.

It should be understood that, although the terms "first", "second", or the like may be used herein to describe various elements, components, regions, layers, and/or portions, these elements, components, regions, and/or portions should not be limited by these terms. These terms are only used to distinguish one element, component, region, layer, or portion from another element, component, region, layer, or portion.

Unless otherwise defined, all terms (including technical and scientific terms) used herein have the same meaning as that commonly understood by one of ordinary skill in the art to which this disclosure belongs.

Figure 1B:
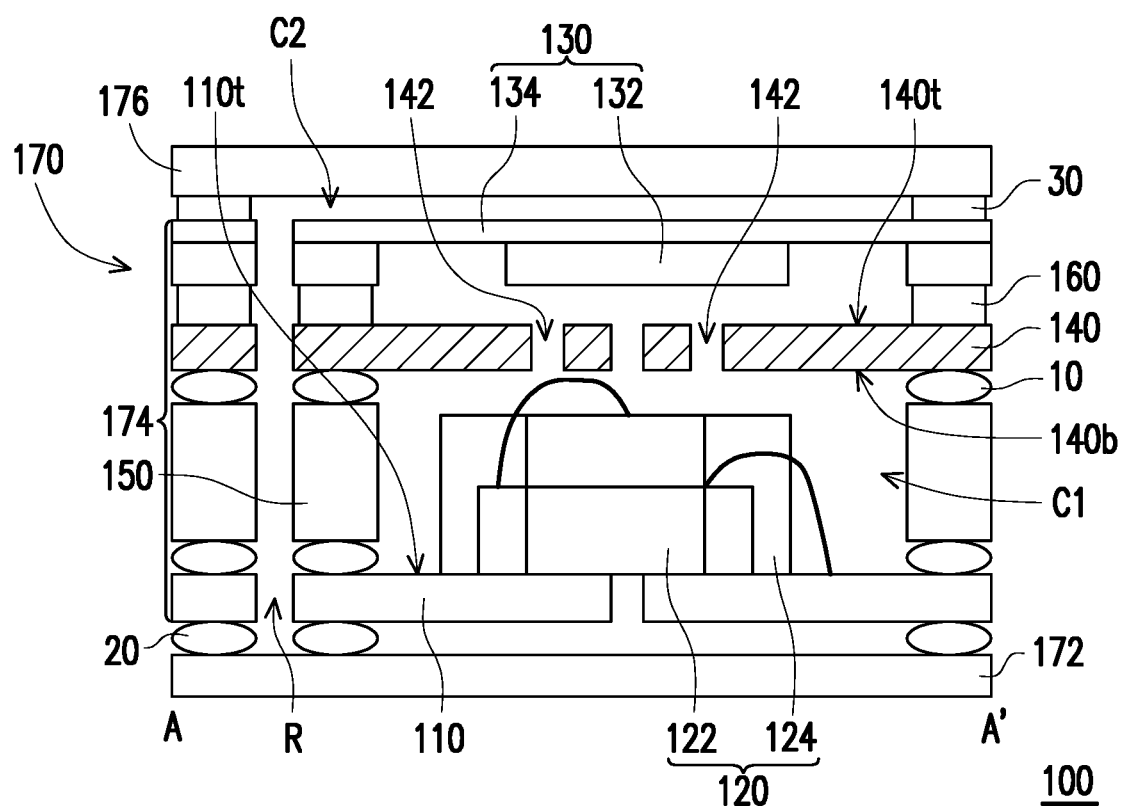
FIG. 1B is a cross-sectional schematic view along a line A-A' in FIG. 1A.
Figure 1C:
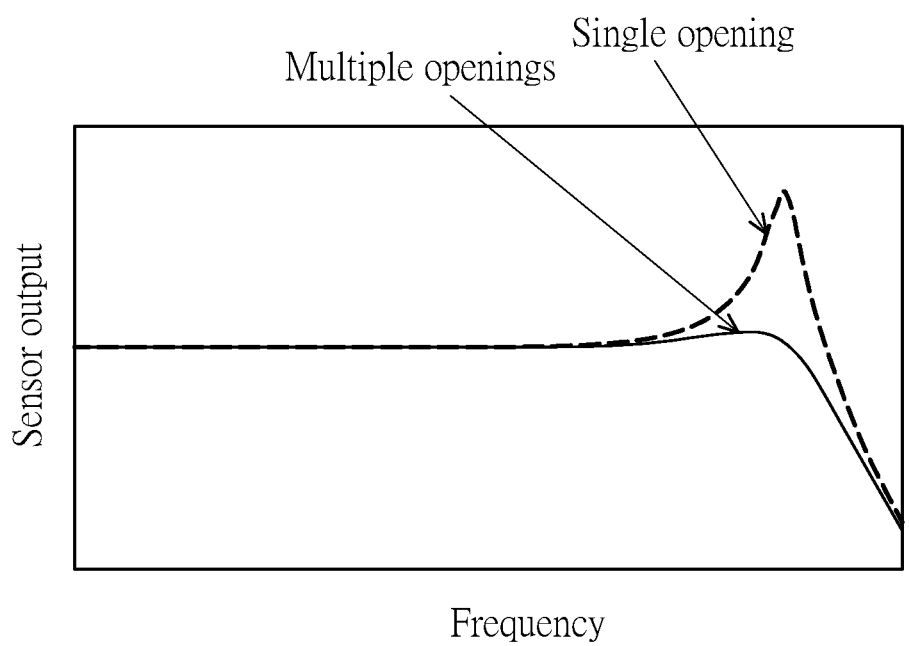
FIG. 1C is a schematic view of frequency response curves of the stopping structure with a single opening and multiple openings.

FIG. 1A is a top schematic view of an electronic device according to an embodiment of the disclosure. FIG. 1B is a cross-sectional schematic view along a line A-A' in FIG. 1A. FIG. 1C is a schematic view of frequency response curves of the stopping structure with a single opening and multiple openings.

Referring to FIG. 1A to FIG. 1C, the electronic device 100 of this embodiment at least includes a substrate 110, a sensor 120, a pressurizing component 130, and a stopping structure 140. The substrate 110 has a bearing surface 110t, the sensor 120 is disposed on the bearing surface 110t, the pressurizing component 130 is disposed on the sensor 120, and the stopping structure 140 is disposed between the pressurizing component 130 and the sensor 120. In addition, the stopping structure 140 has an upper surfaces 140t and a lower surface 140b that are opposite to each other, and multiple openings 142. Each of the openings 142 penetrate from the upper surface 140t to the lower surface 140b. Accordingly, the stopping structure 140 of the electronic device 100 of this embodiment has a design of multiple penetrating openings 142. In this way, the size of a single opening 142 may be reduced, and the friction between the air and the boundary of the opening 142 may be increased, so that the peak of the frequency response curve may be attenuated. Therefore, its air damping may be effectively adjusted to flatten the frequency response.

For example, when manufacturing multiple openings 142 compared with manufacturing only a single opening under the same unit area, the size of each of the multiple openings 142 are smaller than the size of the single opening (which may be considered to reduce the size of the single opening 142). The friction force (affecting the peak of the frequency response curve) is positively correlated to the number of boundaries or size of the perimeter where the air contacts the opening, so when the stopping structure has only a single opening, there is less friction due to a smaller number of boundaries or smaller perimeter that may contact the air, so the peak of the frequency response curve is more prominent. On the other hand, the stopping structure 140 having multiple openings 142 in this embodiment has an obvious attenuation at the peak of the frequency response curve because the boundary or perimeter that may be in contact with the air increases and the friction force increases. Therefore, as shown in FIG. 1C, a flattened curve from low frequency to high frequency (left to right) may be obtained to meet the application requirements of the electronic device 100. Here, the relationship between the opening size and the air resistance (corresponding to the air friction force) may be obtained by the following formula (1). R is the air resistance, μ is the air viscosity coefficient (e.g., the fixed value is $18.6 \times 10^{-6}$ N-s/m²), t is the thickness, and r is the size of the opening. Therefore, when the size of the opening is smaller, the air resistance is larger, the air damping is increased, and the effect of reducing the peak of the frequency response may be achieved. The resonance peak in FIG. 1C is, for example, about 4000 Hz, but the disclosure is not limited thereto.

$$R = \frac{8\mu t}{\pi r^4} \qquad \text{Formula (1)}$$

In this embodiment, in a top view, the shape of each opening 142 is circular, that is, the openings 142 may be multiple circular openings 142, so r in the aforementioned formula (1) is the radius of the opening. Further, the hole diameters (diameters) of the circular openings 142 may range between 0.03 mm and 0.1 mm (e.g., 0.03 mm, 0.04 mm, 0.05 mm, 0.06 mm, 0.07 mm, 0.08 mm, 0.09 mm, 0.1 mm, or any value between 0.03 mm and 0.1 mm). In addition, the circular openings 142 may be arranged regularly. For example, the circular openings 142 may be arranged in an array (e.g., the 3×3 array in FIG. 1A) and symmetrically arranged, but the disclosure is not limited thereto. The circular openings 142 may also be arranged irregularly. On the other hand, as shown in FIG. 1A, the circular openings 142 may have the same size, but the disclosure is not limited thereto. In an embodiment not shown, the circular openings 142 may have different sizes (e.g., different hole diameters). It should be noted that the openings of the disclosure are not limited to the aforementioned embodiments, and the openings may have different implementations, which are further described in other embodiments.

In some embodiments, the electronic device 100 further includes a partition wall structure 150 disposed on the bearing surface 110t and surrounding the sensor 120. The pressurizing component 130, the partition wall structure 150, and the substrate 110 together form a chamber C1, and the stopping structure 140 separates the chamber C1 into at least two cavities, and the air in the two cavities is connected through multiple penetrating openings 142, that is, the presence of the stopping structure 140 does not affect the conduction of the air pressure of the electronic device 100 to the sensor 120, but the disclosure is not limited thereto.

In some embodiments, the partition wall structure 150 and the stopping structure 140, and the partition wall structure 150 and the substrate 110 may be bonded by the adhesive material 10. The adhesive material 10 includes solder paste or other suitable materials, but the disclosure is not limited thereto.

In some embodiments, the pressurizing component 130 includes a mass 132 and a vibration membrane 134, and the electronic device 100 further includes an adhesive layer 160 for bonding the pressurizing component 130 and the stopping structure 140. The adhesive layer 160 is disposed on the upper surface 140t of the stopping structure 140, but the disclosure is not limited thereto.

In some embodiments, the electronic device 100 further includes a peripheral structure 170 surrounding the chamber C1, so that the peripheral structure 170 and the substrate 110, the pressurizing component 130, the stopping structure 140, and the partition wall structure 150 form another chamber C2, in which the chamber C2 may form an air feedback path. Further, the peripheral structure 170 includes another substrate 172, a connecting portion 174, and a cover 176. The connecting portion 174 may be formed by integrally forming the substrate 110, the pressurizing component 130, the stopping structure 140, the partition wall structure 150, and the adhesive layer 160. For example, the slit R may be formed by patterning the substrate 110, the pressurizing component 130, the stopping structure 140, the partition wall structure 150, and the adhesive layer 160 to separate the space forming the chamber C2. That is, the connecting portion 174 of the peripheral structure 170 may be formed of the same material as the substrate 110, the pressurizing component 130, the stopping structure 140, the partition wall structure 150, and the adhesive layer 160. In addition, the adhesive material 10 may also be used in the connecting portion 174 to bond the components, but the disclosure is not limited thereto. The forming method of the connecting portion 174 may be determined according to the actual design requirements, that is, the connecting portion 174 may also not include the slit R and the chamber C2 is formed by other methods.

In some embodiments, the substrate 172 and the connecting portion 174 may be bonded by an adhesive material 20 (e.g., solder paste). The connecting portion 174 and the cover 176, and the vibration membrane 134 and the cover 176 may be bonded by the adhesive layer 30, but the disclosure is not limited thereto.

In some embodiments, the substrate 110 and the substrate 172 may be circuit substrates, for example, the substrate 110 and the substrate 172 are printed circuit boards (PCB), and the material of the partition wall structure 150 includes stainless steel, copper, printed circuit boards, or high temperature (which may be reflowed) materials, but the disclosure is not limited thereto.

In some embodiments, the sensor 120 may include a processing chip 122 and a sensing chip 124. Further, the sensing chip 124 may be a microphone element to sense the change in air pressure generated by the vibration of the pressurizing component 140, and the processing chip 122 may be an application specific integrated circuit (ASIC) to receive and process the signal measured by the microphone element, but the disclosure is not limited thereto.

In some embodiments, the processing chip 122 is disposed adjacent to the sensing chip 124, the sensing chip 124 is electrically connected to the processing chip 122 by wire bonding, and the processing chip 122 is electrically connected to the substrate 110 by wire bonding, but the disclosure is not limited thereto. The processing chip 122 and the sensing chip 124 may be disposed and connected according to actual design requirements.

In some embodiments, the material of the mass 132 includes metal (e.g., stainless steel or copper), and the material of the vibration membrane 134 includes plastic (e.g., polytetrafluoroethene (PTFE), polyethylene (PE), polyimide (PI) or polyether ether ketone (PEEK)), the material of the adhesive layer 30 and the adhesive layer 160 includes silicone, and the material of the cover 176 includes stainless steel or copper, but the disclosure is not limited thereto. The aforementioned components may be replaced by any other suitable materials. In addition, the aforementioned film layers and components may be formed by any suitable process, but the disclosure is not limited thereto.

It is to be noted that the following embodiments use the reference numerals and a part of the contents of the above embodiment, and the same or similar reference numerals are used to denote the same or similar elements, and the description of the same technical content is omitted. For the description of the omitted portion, reference may be made to the foregoing embodiments, which is not repeated in the following embodiments.

FIG. 1D, FIG. 1E, FIG. 1F, and FIG. 1G are top schematic views of electronic devices according to some embodiments of the disclosure.

Figure 1D:
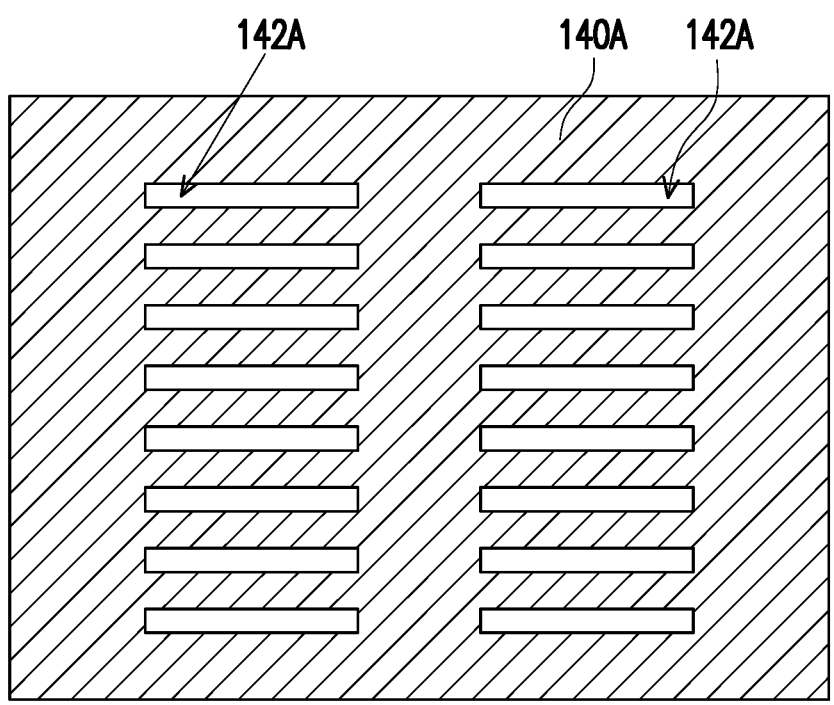
FIG. 1D, FIG. 1E, FIG. 1F, and FIG. 1G are top schematic views of electronic devices according to some embodiments of the disclosure.

Referring to FIG. 1D, compared with the electronic device 100 of FIG. 1A, the openings 142A of the stopping structure 140A of the electronic device 100A may be rectangular, that is, the openings 142A are rectangular openings 142A. The rectangular opening 142A has opposite long sides and short sides, and the length of the short side may be between 0.03 mm and 0.1 mm (for example, 0.03 mm, 0.04 mm, 0.05 mm, 0.06 mm, 0.07 mm, 0.08 mm, 0.09 mm, 0.1 mm, or any value between 0.03 mm and 0.1 mm), but the disclosure is not limited thereto.

Figure 1E:
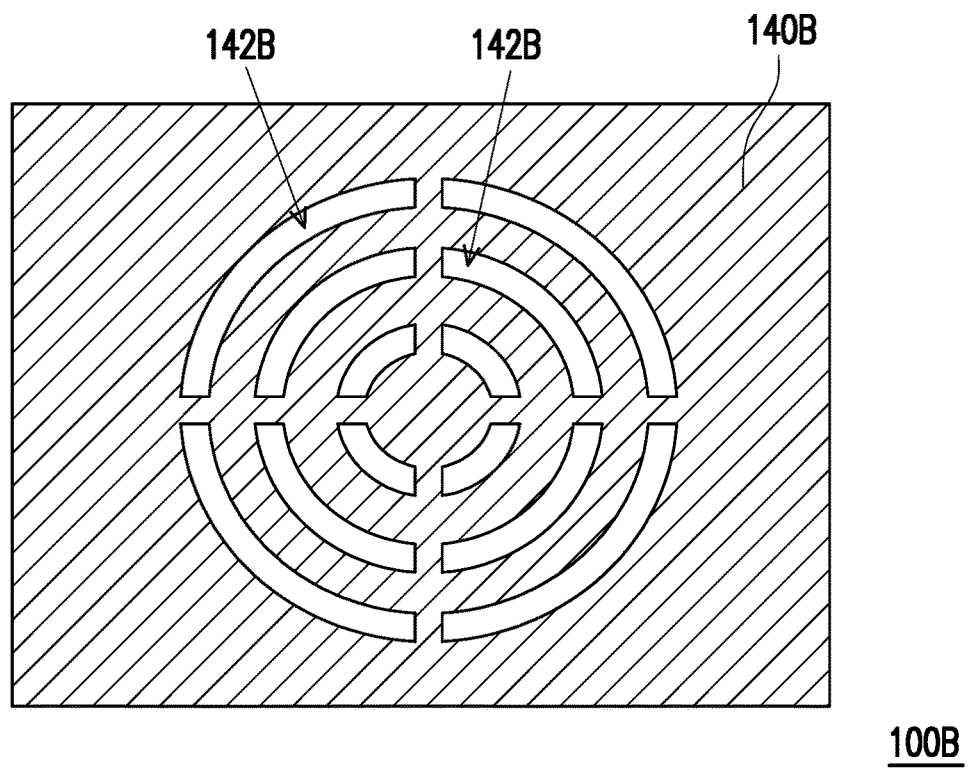

Referring to FIG. 1E, compared with the electronic device 100 of FIG. 1A, the openings 142B of the stopping structure 140B of the electronic device 100B may be arc-shaped, that is, the openings 142B are arc-shaped openings 142B. The disposition positions of the arc-shaped openings 142B form at least one circular outline. Further, the at least one circular outline may be a non-closed circular outline, but the disclosure is not limited thereto.

Figure 1F:
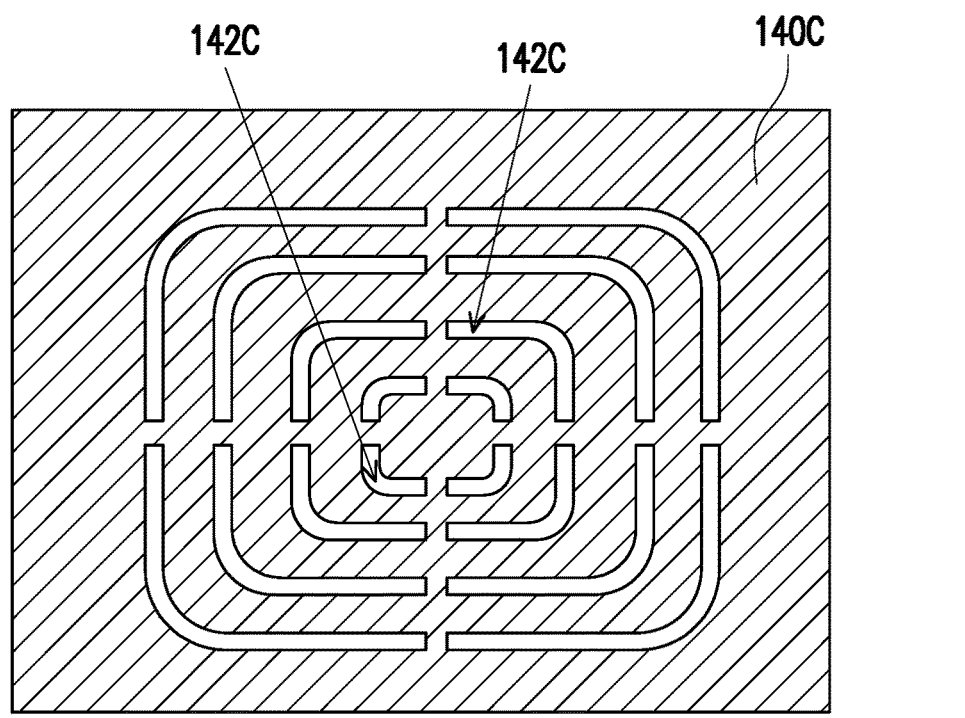

Referring to FIG. 1F, compared with the electronic device 100 of FIG. 1A, the openings 142C of the stopping structure 140C of the electronic device 100C may be L-shaped, that is, the openings 142C are L-shaped openings 142C. The disposition positions of the L-shaped openings 142C form at least one rectangular outline. Further, the at least one rectangular outline may be a non-closed rectangular outline, but the disclosure is not limited thereto.

Figure 1G:
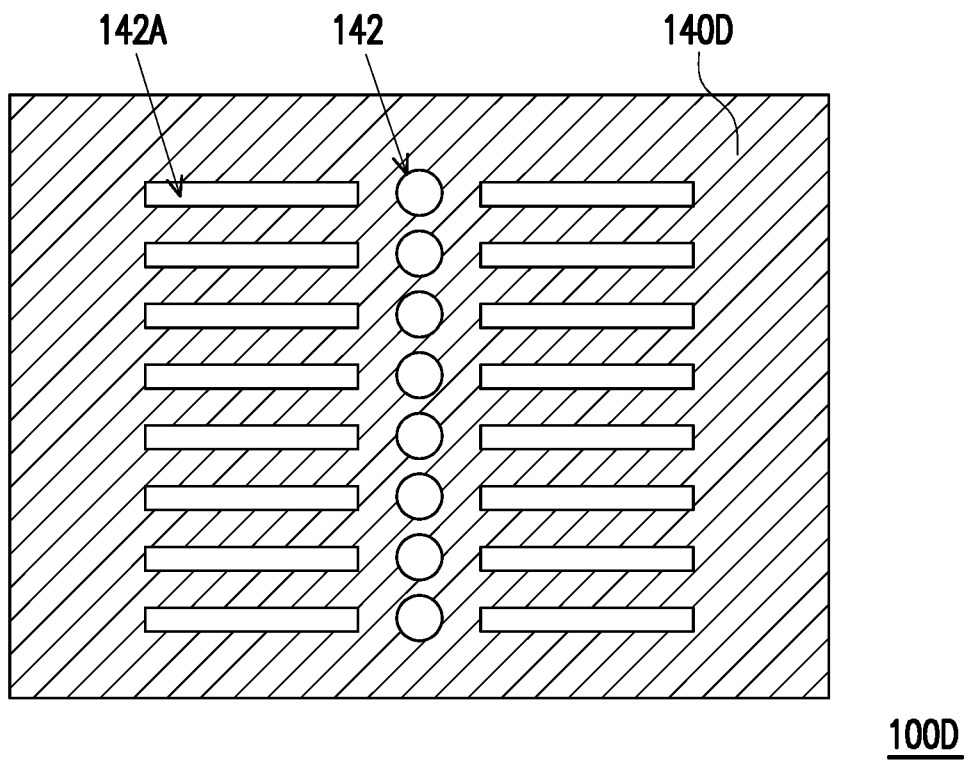

Referring to FIG. 1G, compared with the electronic device 100 of FIG. 1A, the stopping structure 140D of the electronic device 100D may be formed of circular openings 142 and rectangular openings 142A of different shapes and sizes, but the disclosure is not limited thereto.

It should be noted that the multiple openings of the disclosure may be a combination of the aforementioned various embodiments, that is, the multiple openings of the disclosure may any arbitrary combination having different sizes, different shapes, the same size, and the same shape, as long as there are multiple openings, they all belong to the protection scope of the disclosure. In addition, in FIG. 1D to FIG. 1G, the slit R as shown in FIG. 1A may be selectively formed in the stopping structure according to actual design requirements. The slit may also be omitted.

Figure 2A:
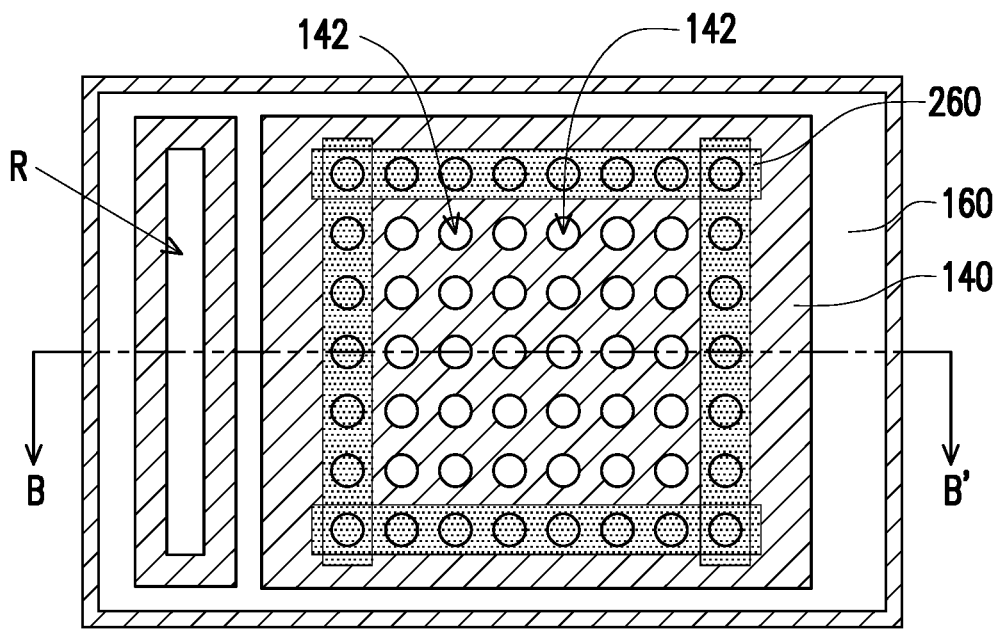
FIG. 2A is a top schematic view of an electronic device according to another embodiment of the disclosure.
Figure 2B:
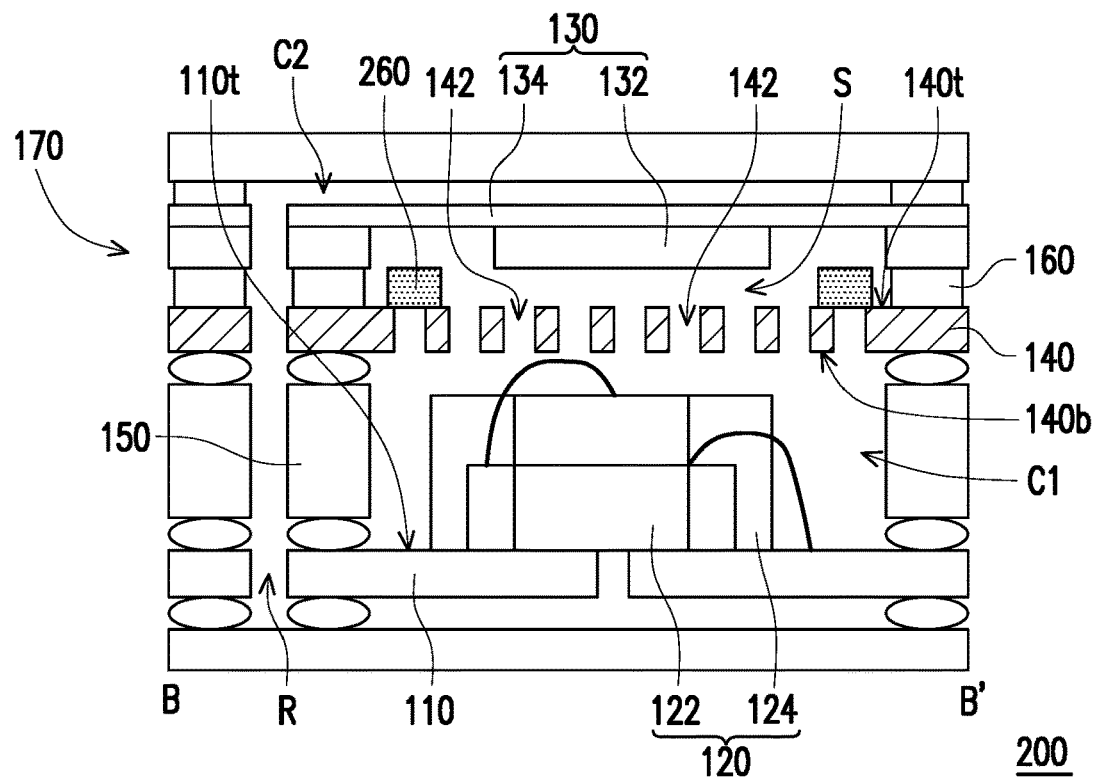
FIG. 2B is a cross-sectional schematic view along a line B-B' in FIG. 2A.

FIG. 2A is a top schematic view of an electronic device according to another embodiment of the disclosure. FIG. 2B is a cross-sectional schematic view along a line B-B' in FIG. 2A. Referring to FIG. 2A and FIG. 2B, compared with the electronic device 100 of FIG. 1A, the electronic device 200 further includes an adhesive layer 260. The adhesive layer 260 is disposed on the upper surface 140t of the stopping structure 140 to cover a portion of the opening 142. Further, in this embodiment, the adhesive layer 260 and the adhesive layer 160 may be formed simultaneously in the same process (the adhesive layer 160 surrounds the adhesive layer 260) to simplify the manufacturing process and reduce the cost. Therefore, the thickness of the adhesive layer 260 may be equal to the thickness of the adhesive layer 160, and the thickness of the adhesive layer 260 is greater than or equal to the gap S between the mass 132 and the stopping structure 140. In this embodiment, the adhesive layer 260 and the mass 132 are staggered in the orthographic direction (e.g., disposed in the peripheral area of the array opening 142), so as to prevent the electronic device 200 from being inoperable due to the impact of the mass 132 on the adhesive layer 260 when vibrating, but the disclosure is not limited thereto. Here, the adhesive layer 260 and the mass 132 are staggered in the orthographic direction, for example, the adhesive layer 260 and the mass 132 do not have overlapping portions in the orthographic direction.

Figure 2C:
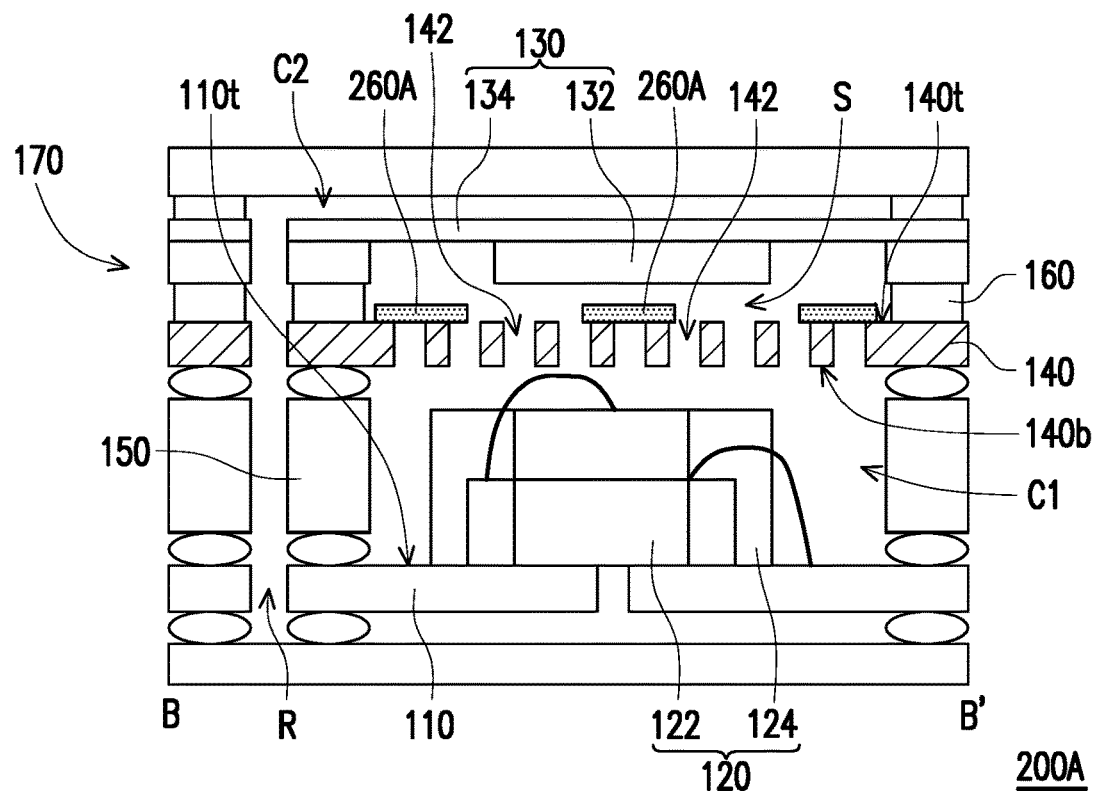
FIG. 2C is a cross-sectional schematic view of an electronic device according to yet another embodiment of the disclosure.

FIG. 2C is a cross-sectional schematic view of an electronic device according to yet another embodiment of the disclosure. Referring to FIG. 2C, compared to the electronic device 200 of FIG. 2B, the thickness of the adhesive layer 260A of the electronic device 200A is smaller than the thickness of the adhesive layer 160. In other words, the thickness of the adhesive layer 160 is greater than the thickness of the adhesive layer 260A, and the thickness of the adhesive layer 260A is smaller than the gap S. In this embodiment, the problem that the electronic device 200 becomes inoperable due to the impact of the mass 132 on the adhesive layer 260 when vibrating does not exist. Therefore, the adhesive layer 260A may be located on both sides and/or below the mass 132, so that the disposition flexibility of the adhesive layer 260A may be further improved, but the disclosure is not limited thereto.

In some embodiments, the thicknesses of the aforementioned adhesive layer 260 and the adhesive layer 260A are between 10 μm and 50 μm (e.g., 10 μm, 15 μm, 20 μm, 25 μm, 30 μm, 35 μm, 40 μm, 50 μm, or any value between 10 μm and 50 μm), but the disclosure is not limited thereto. The thicknesses of the adhesive layer 260 and the adhesive layer 260A may be selected according to actual design requirements.

To sum up, the stopping structure of the electronic device of the disclosure has a design of multiple penetrating openings. In this way, the size of a single opening may be reduced, and the friction between the air and the opening boundary may be increased, so that the peak of the frequency response curve may be attenuated. Therefore, its air damping may be effectively adjusted to flatten the frequency response.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. An electronic device, comprising:
    a substrate, having a bearing surface;
    a sensor, disposed on the bearing surface;
    a pressurizing component, disposed on the sensor;
    a stopping structure, disposed between the pressurizing component and the sensor, wherein the stopping structure has an upper surface and a lower surface that are opposite to each other and a plurality of openings, and each of the openings penetrate from the upper surface to the lower surface; and
    a first adhesive layer, disposed on the upper surface of the stopping structure to cover a portion of the openings.

2. The electronic device according to claim 1, wherein in a top view, a shape of each of the openings comprises a circle, a rectangle, an arc-shape, an L-shape, or a combination thereof.

3. The electronic device according to claim 1, wherein the openings are a plurality of circular openings, and hole diameters of the circular openings are between 0.03 mm and 0.1 mm.

4. The electronic device according to claim 1, wherein the openings are a plurality of arc-shaped openings, and disposition positions of the arc-shaped openings form at least one circular outline.

5. The electronic device according to claim 1, wherein the openings are a plurality of L-shaped openings, and disposition positions of the L-shaped openings form at least one rectangular outline.

6. The electronic device according to claim 1, wherein the openings are disposed in an array and are symmetrically arranged.

7. The electronic device according to claim 1, wherein the openings have at least different sizes or different shapes.

8. The electronic device according to claim 1, wherein a thickness of the first adhesive layer is between 10 μm and 50 μm.

9. The electronic device according to claim 1, wherein the pressurizing component comprises a mass and a vibration membrane, wherein a gap is formed between the mass and the stopping structure.

10. The electronic device according to claim 9, wherein the first adhesive layer and the mass are staggered in an orthographic projection direction.

11. The electronic device according to claim 9, wherein the first adhesive layer is located on both sides and/or below the mass, and a thickness of the first adhesive layer is smaller than the gap.

12. The electronic device according to claim 1, further comprising a second adhesive layer, disposed on the upper surface of the stopping structure and surrounding the first adhesive layer, wherein a thickness of the second adhesive layer is equal to or greater than a thickness of the first adhesive layer.

13. The electronic device according to claim 1, further comprising a partition wall structure, disposed on the bearing surface and surrounding the sensor, wherein the pressurizing component, the partition wall structure, and the substrate together form a first chamber, the stopping structure separates the first chamber into at least two cavities, and air in the two cavities is connected through the openings.

* * * * *